(12) United States Patent
Woo et al.

(10) Patent No.: US 9,678,400 B2
(45) Date of Patent: Jun. 13, 2017

(54) ARRAY SUBSTRATE FOR LIQUID CRYSTAL DISPLAY AND MANUFACTURING METHOD THEREOF

(71) Applicant: LG DISPLAY CO., LTD., Seoul (KR)

(72) Inventors: YoonHwan Woo, Seoul (KR); SunJung Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 73 days.

(21) Appl. No.: 14/520,603

(22) Filed: Oct. 22, 2014

(65) Prior Publication Data

US 2015/0034956 A1 Feb. 5, 2015

Related U.S. Application Data

(62) Division of application No. 13/728,164, filed on Dec. 27, 2012, now Pat. No. 8,927,998.

(30) Foreign Application Priority Data

May 31, 2012 (KR) .......................... 10-2012-0057966

(51) Int. Cl.
*H01L 27/14* (2006.01)
*G02F 1/1368* (2006.01)
(Continued)

(52) U.S. Cl.
CPC ........ *G02F 1/1368* (2013.01); *G02F 1/13458* (2013.01); *H01L 27/124* (2013.01); *H01L 33/36* (2013.01); *G02F 2001/134372* (2013.01)

(58) Field of Classification Search
CPC ....... G02F 2001/1635; G02F 1/136213; G02F 2001/13685; G02F 1/0045; G02F 1/1303;
(Continued)

(56) References Cited

U.S. PATENT DOCUMENTS

2003/0020064 A1 1/2003 Hashimoto et al.
2005/0197031 A1* 9/2005 Yamazaki ............... H01L 51/52
445/24
(Continued)

FOREIGN PATENT DOCUMENTS

CN 101414082 A 4/2009
KR 10-2002-0075626 A 10/2002
KR 10-2012-0030695 A 3/2012

OTHER PUBLICATIONS

Office Action dated Oct. 15, 2013, issued by the Korean Intellectual Property Office in Korean Patent Application No. 10-2012-0057966.

*Primary Examiner* — Victor A Mandala
*Assistant Examiner* — Colleen E Snow
(74) *Attorney, Agent, or Firm* — Morgan, Lewis & Bockius LLP

(57) ABSTRACT

An array substrate for a liquid crystal display (LCD) and manufacturing method thereof are provided. The array substrate for a liquid crystal display (LCD) includes: a substrate, including: a gate electrode, a pixel electrode, and a common electrode, a gate pad formed on the substrate, and connected to the gate electrode, a gate insulating layer formed on the gate pad, a first protective layer formed on the gate insulating layer, a second protective layer formed on the first protective layer, a first metal layer formed on the second protective layer, and connected to the gate pad through a first contact hole which exposes the gate pad, a third protective layer formed on the first metal layer and the second protective layer, and a second metal layer formed on the third protective layer, and connected to the first metal layer through a second contact hole which exposes the first metal layer.

18 Claims, 8 Drawing Sheets

(51) Int. Cl.
*H01L 33/36* (2010.01)
*G02F 1/1345* (2006.01)
*H01L 27/12* (2006.01)
*G02F 1/1343* (2006.01)

(58) Field of Classification Search
CPC ... G02F 1/1368; G02F 1/3458; G09G 3/3655; H01L 27/3244; H01L 27/1251; H01L 27/3248; H01L 27/3262; H01L 27/10808; H01L 27/326; H01L 27/124; H01L 33/36
See application file for complete search history.

(56) References Cited

U.S. PATENT DOCUMENTS

| | | | |
|---|---|---|---|
| 2006/0097265 A1* | 5/2006 | Jeong | G02F 1/136286 257/72 |
| 2009/0102994 A1 | 4/2009 | Oh et al. | |
| 2009/0121229 A1* | 5/2009 | Saitou | G02F 1/1345 257/59 |
| 2009/0167975 A1* | 7/2009 | Lee | G02F 1/13458 349/43 |
| 2009/0284679 A1* | 11/2009 | Kim | G02F 1/1309 349/54 |
| 2012/0069257 A1 | 3/2012 | Oh et al. | |

* cited by examiner

ARRAY SUBSTRATE FOR LIQUID CRYSTAL DISPLAY AND MANUFACTURING METHOD THEREOF

CROSS-REFERENCE TO RELATED APPLICATION(S)

This application is a divisional of U.S. patent application Ser. No. 13/728,164, now U.S. Pat. No. 8,927,998, filed on Dec. 27, 2012, which claims the benefit under 35 U.S.C. §119(a) of Korean Patent Application No. 10-2012-0057966, filed on May 31, 2012, in the Korean Intellectual Property Office, the entire disclosure of each of which is incorporated by reference herein for all purposes.

BACKGROUND

1. Technical Field

The following description relates to a liquid crystal display (LCD), and more particularly, to an array substrate for LCDs.

2. Discussion of the Related Art

In-plane switching (IPS) LCDs, in which a plurality of electrodes are alternately disposed at one of upper and lower substrates and liquid crystal is aligned between the substrates to thereby display an image, are being recently developed as a type of LCD.

Generally, IPS LCDs adjust the light transmittance of liquid crystal having dielectric anisotropy by using an electric field and thus display an image. Here, a color filter substrate with a color filter array formed therein and a thin film transistor (TFT) substrate with a TFT array formed therein are coupled to each other with liquid crystal therebetween, thereby forming an IPS LCD.

The TFT array substrate includes a TFT, a pixel electrode, and a common electrode that are formed in each of a plurality of cell areas that are formed by intersection between a plurality of gate lines and data lines. The TFT switches a data signal, applied from a corresponding data line, to the pixel electrode in response to a gate signal from the gate line. The pixel electrode receives a data signal from the TFT to thereby drive the liquid crystal, and the common electrode receives a common voltage that becomes a reference for swing of data voltages in driving the liquid crystal. The liquid crystal is twisted with an electric field that is generated with the data signal of the pixel electrode and the common voltage of the common electrode, and thus adjusts a light transmittance, thereby realizing a gray scale.

The TFT array substrate for IPS LCDs includes a TFT area, a pixel area, a data line area, a gate pad area, and a data pad area, and may further include a plurality of contact holes for electrically connecting different layers. However, in a related art array substrate for the IPS LCD, the damage of a lower layer and the inter-layer short are caused in electrically connecting the different layers through the contact holes, and particularly, the frequency of occurrence of the drawbacks is high in the gate pad area.

Hereinafter, drawbacks that can occur in the gate pad area of the related art array substrate for LCDs will be described with reference to FIGS. 1 to 6.

FIGS. 1 to 5 are sectional views for describing a related art method of manufacturing a gate pad area of an array substrate for LCDs.

First, as illustrated in FIG. 1, a gate pad 110, a gate insulating layer 120, a first passivation layer 130, and a photo acryl layer 140 are sequentially formed on a substrate 100.

Subsequently, as illustrated in FIGS. 2 and 3, a first metal layer 150 is formed on the photo acryl layer 140, and a second passivation layer 160 is formed on the first metal layer 150.

Subsequently, as illustrated in FIG. 4, a contact hole 180 for exposing the gate pad 110 is formed by patterning the second passivation layer 160, the first passivation layer 130, and the gate insulating layer 120.

Subsequently, as illustrated in FIG. 5, a second metal layer 170 that is connected to the gate pad 110 through the contact hole 180 is formed.

However, in the related art process of manufacturing the gate pad area of the array substrate for LCDs, some drawbacks are caused when a contact hole is deep or a step height between stacked layers is large.

Such drawbacks will be described in detail with reference to FIGS. 6A and 6B.

FIG. 6A is an enlarged sectional view of a portion A of FIG. 5, and FIG. 6B is an enlarged sectional view of a portion B of FIG. 5.

FIG. 6A is a sectional view illustrating the disconnection of the second metal layer 170 in a process that forms the contact hole 180 for exposing the gate pad 110 by patterning the second passivation layer 160, the first passivation layer 130, and the gate insulating layer 120, and then forms the second metal layer 170 connected to the gate pad 110. As illustrated in FIG. 6A, when a step height between the gate pad 110 and the second metal layer 170 is large, the depth of the contact hole 180 becomes greater, and thus, the second metal layer 170 is not conformally formed, causing the disconnection of the second metal layer 170.

FIG. 6B is a sectional view illustrating a defective contact between the gate pad 110 and the second metal layer 170 in a process that forms the contact hole 180 for exposing the gate pad 110 by patterning the second passivation layer 160, the first passivation layer 130, and the gate insulating layer 120, and then forms the second metal layer 170 connected to the gate pad 110. As illustrated in FIG. 6B, in an etching process of forming the contact hole 180, a plurality of etched layers are thick, and thus, when the gate insulating layer 120 that is the lowermost layer to be etched is not completely etched and thus a residual layer is left, a contact between the gate pad 110 and the second metal layer 170 is not made due to the residual layer of the gate insulating layer 120.

The above-described limitations of the related art array substrate for LCDs are as follows.

First, when a step height between the gate pad and the second metal layer is large, the depth of the contact hole that is formed for electrically connecting the gate pad and the second metal layer becomes greater, and thus, the second metal layer cannot conformally be formed on the surface of the contact hole, causing the disconnection of the second metal layer.

Second, in the etching process of forming the contact hole 180, many layers are stacked between the gate pad and the second metal layer or the stacked layers are thick, and thus, when the gate insulating layer 120 that is the lowermost layer to be etched is not completely etched and thus a residual layer is left, a contact between the gate pad 110 and the second metal layer 170 is not made due to the residual layer of the gate insulating layer 120.

SUMMARY

Embodiments of the present invention relate to an array substrate for liquid crystal display and manufacturing method thereof. Accordingly, embodiments of the present invention are directed to provide an array substrate of LCDs and a manufacturing method thereof that substantially obviate one or more problems due to limitations and disadvantages of the related art.

An object of embodiments is to provide an array substrate for LCDs in which the disconnection of a second metal layer is solved at a surface of a contact hole, and a defective contact between the second metal layer and a gate pad due to a residual layer of a gate insulating layer is prevented.

Advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose according to one aspect of the invention, there is provided an array substrate for a liquid crystal display (LCD), including: a substrate, including: a gate electrode, a pixel electrode, and a common electrode, a gate pad formed on the substrate, and connected to the gate electrode, a gate insulating layer formed on the gate pad, a first protective layer formed on the gate insulating layer, a second protective layer formed on the first protective layer, a first metal layer formed on the second protective layer, and connected to the gate pad through a first contact hole which exposes the gate pad, a third protective layer formed on the first metal layer and the second protective layer, and a second metal layer formed on the third protective layer, and connected to the first metal layer through a second contact hole which exposes the first metal layer.

In another aspect, there is provided a method of manufacturing an array substrate for a liquid crystal display (LCD), the method including: forming a gate pad on a substrate, forming a gate insulating layer on the gate pad, forming a first protective layer on the gate insulating layer, forming a second protective layer on the first protective layer such that the first protective layer formed at a position corresponding to the gate pad is exposed, patterning the gate insulating layer and the first protective layer to form a first contact hole which exposes the gate pad, forming a first metal layer on the first contact hole and the second protective layer, forming a third protective layer on the first metal layer and the second protective layer, forming a second contact hole on the third protective layer, the second contact hole exposing the first metal layer, and forming a second metal layer which is connected to the first metal layer through the second contact hole.

In another aspect, there is provided an array substrate for a liquid crystal display (LCD), including: a substrate, a pixel area on the substrate, the pixel area including: a transistor, including: a gate electrode, a source electrode, a drain electrode, an active layer, and a gate insulating layer, a first protective layer on the transistor, a second protective layer on the first protective layer, a pixel electrode, the pixel electrode being connected to the drain electrode through a first contact hole that exposes the drain electrode, a third protective layer completely covering the pixel electrode and the second protective layer, and a common electrode on the third protective layer, a gate pad area on the substrate, the gate pad area including: a gate pad, the gate insulating layer, the first protective layer, the second protective layer, a first metal layer, the third protective layer, and the second metal layer, wherein the first metal layer is disposed on the second protective layer, and is connected to the gate pad through a second contact hole that exposes the gate pad, wherein the first metal layer includes a same material and is disposed in a same layer as the pixel electrode, wherein the third protective layer is disposed on the first metal layer and the second protective layer, wherein the second metal layer is disposed on the third protective layer, and is connected to the first metal layer through the second contact hole that exposes the first metal layer, wherein the second metal layer is connected to the first metal layer, and the second metal layer is electrically connected to the gate pad, and wherein the second metal layer includes a same material and is disposed in a same layer as the common electrode.

In another aspect, there is provided a method of forming an array substrate for a liquid crystal display (LCD), the method including: forming a substrate, forming a pixel area on the substrate, forming the pixel area including: forming a transistor, including: forming a gate electrode, forming a source electrode, forming a drain electrode, forming an active layer, and forming a gate insulating layer, forming a first protective layer on the transistor, forming a second protective layer on the first protective layer, forming a pixel electrode connected to the drain electrode through a first contact hole that exposes the drain electrode, forming a third protective layer completely covering the pixel electrode and the second protective layer, and forming a common electrode on the third protective layer, forming a gate pad area on the substrate, forming the gate pad area including: forming a gate pad, forming the gate insulating layer on the gate pad, forming the first protective layer on the gate insulating layer, forming the second protective layer on the first protective layer, forming a first metal layer on the second protective layer, forming the third protective layer on the first metal layer, and forming the second metal layer on the third protective layer, wherein the first metal layer is disposed on the second protective layer, and is connected to the gate pad through a second contact hole that exposes the gate pad, wherein the first metal layer includes a same material as the pixel electrode and is formed simultaneously with the pixel electrode, wherein the third protective layer is disposed on the first metal layer and the second protective layer, wherein the second metal layer is disposed on the third protective layer, and is connected to the first metal layer through the second contact hole that exposes the first metal layer, wherein the second metal layer is connected to the first metal layer, and the second metal layer is electrically connected to the gate pad, and wherein the second metal layer includes a same material as the common electrode and is formed simultaneously with the common electrode.

It is to be understood that both the foregoing general description and the following detailed description are examples and explanatory and are intended to provide further explanation of embodiments of the invention as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the invention.

Figure 1:
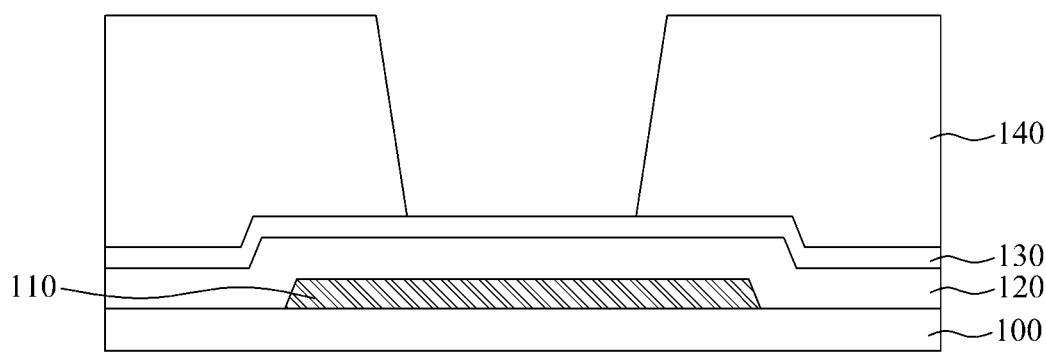
FIGS. 1 to 5 are sectional views for describing a related art method of manufacturing a gate pad area of an array substrate for LCDs.
Figure 2:
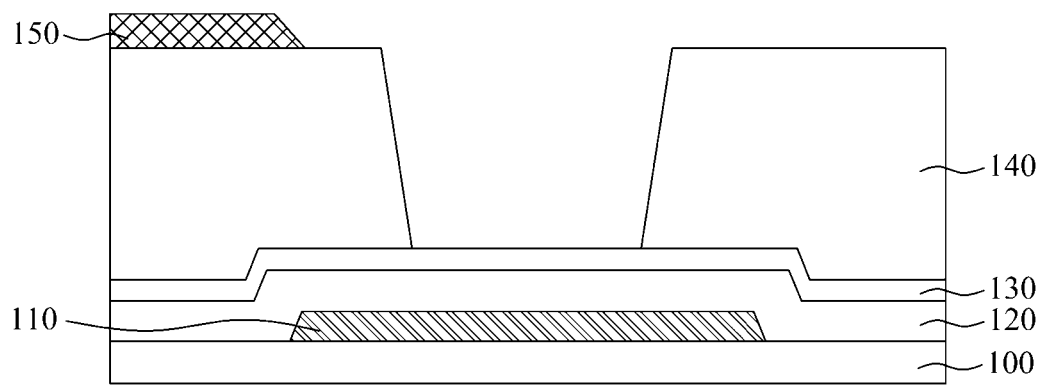
Figure 3:
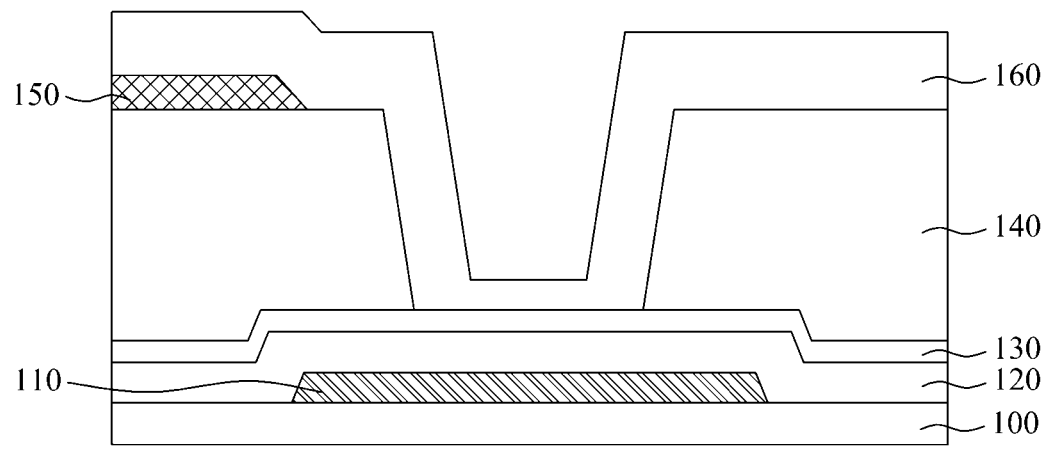
Figure 4:
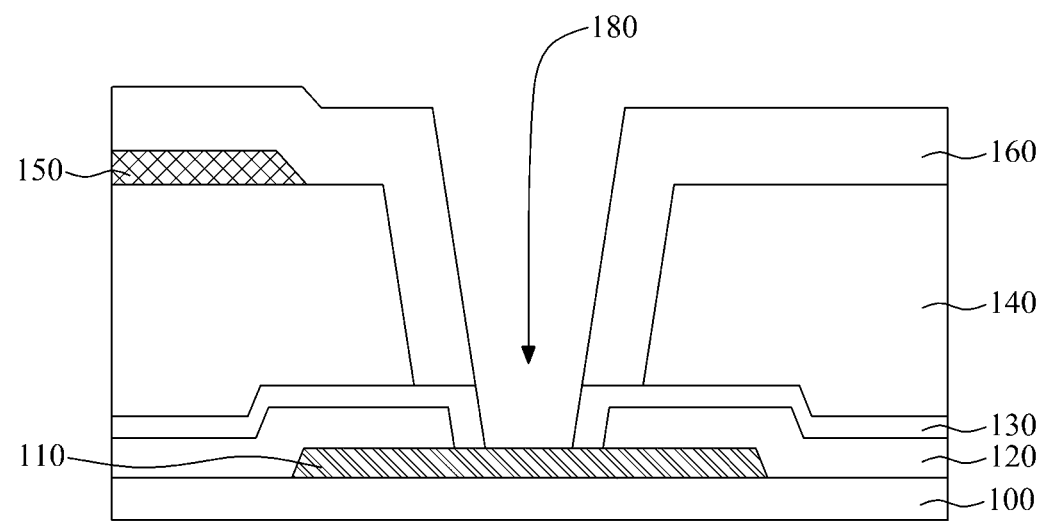
Figure 5:
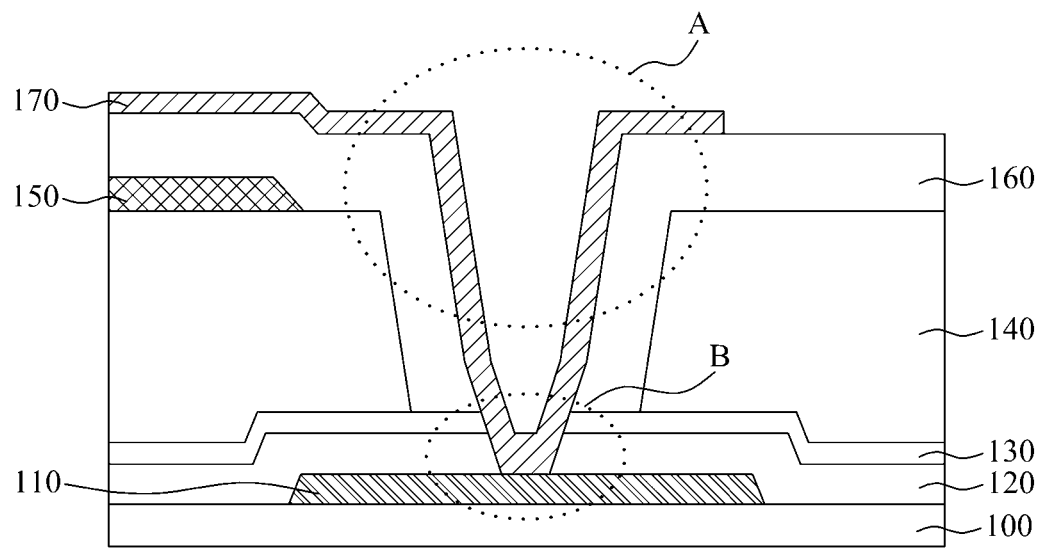

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present invention, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

In description of embodiments of the present invention, when a structure is described as being formed on/under another structure, this description should be construed as including a case where the structures contact each other and moreover a case where a third structure is disposed therebetween.

Hereinafter, an array substrate for LCDs according to an embodiment will be described in detail with reference to FIGS. 7 and 8.

Figure 7:
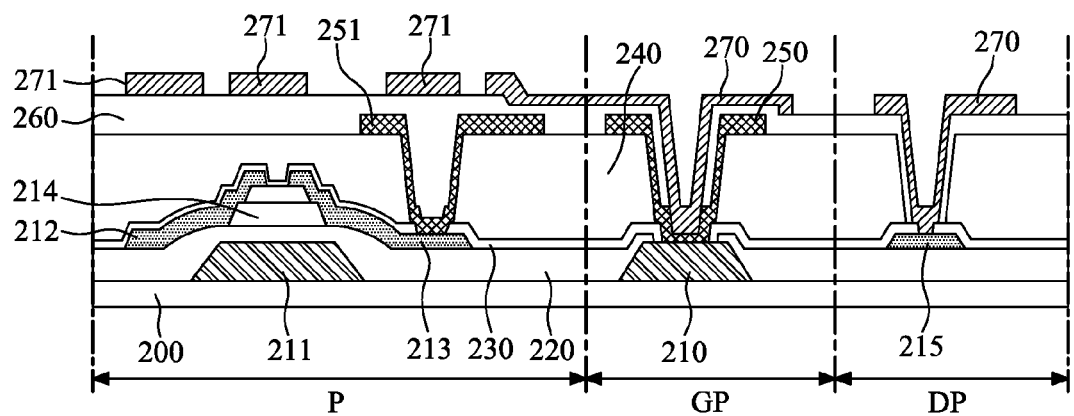
FIG. 7 is a sectional view illustrating an array substrate for LCDs according to an embodiment.

FIG. 7 is a sectional view illustrating an array substrate for LCDs according to an embodiment.

In the array substrate for LCDs according to an embodiment of the present invention, as illustrated in FIG. 7, a plurality of TFTs that are a plurality of switching elements may be disposed in a matrix type, and a plurality of gate lines (not shown) respectively connected to the TFTs and a plurality of data lines (not shown) respectively connected to the TFTs may be formed to intersect. A gate pad 210 may be formed at one end of a gate line, and a data pad 214 may be formed at one end of a data line.

The gate pad 210 and the data pad 214 may respectively contact a second metal layer for directly receiving external signals.

A pixel area P, which is defined by intersection between a gate line and a data line, may include a substrate 200, a TFT, a first protective layer 230, a second protective layer 240, a pixel electrode 251, a third protective layer 260, and a common electrode 271.

The TFT may be formed as a switching element in the pixel area P on the substrate 200, and may include a gate electrode 211, a source electrode 212, a drain electrode 213, an active layer 214, and a gate insulating layer 220. In one example, the substrate 200 may be formed of glass or transparent plastic.

As illustrated in FIG. 7, the TFT of an embodiment may have a bottom gate structure in which the gate electrode 211 is formed under the active layer 214, or may have a top gate structure in which the gate electrode 211 is formed on the active layer 214.

The first protective layer 230 may be formed on the TFT to protect the TFT, and may be formed as a passivation layer. The second protective layer 240 may be formed on the first protective layer 230, and may be formed, for example, of photo acryl (PAC). The first and second protective layers 230, 240 may be formed of the same or different materials.

The pixel electrode 251 may be formed on the second protective layer 240, and may be connected to the drain electrode 213 through a contact hole that may expose the drain electrode 213. In one example, the pixel electrode 251 may be formed of a transparent conductor, such as indium tin oxide (ITO).

The third protective layer 260 may be formed on the pixel electrode 251 and the second protective layer 240, and may be formed as a passivation layer.

The common electrode 271 may be formed on the third protective layer 260, and may be formed of a transparent conductor, such as ITO.

Next, a gate pad area GP may include the substrate 200, the gate pad 210, the gate insulating layer 220, the first protective layer 230, the second protective layer 240, a first metal layer 250, the third protective layer 260, and the second metal layer 270.

The gate pad 210 may be formed on the substrate 200, and may be formed of the same material as that of the gate electrode 211 though the same process as that of the gate electrode 211. The gate insulating layer 210, the first protective layer 230, and the second protective layer 240 may be formed on the gate pad 210. In one example, the first protective layer 230 may be formed as a passivation layer, and the second protective layer 240 may be formed of photo acryl. The second protective layer 240 may be formed on the first protective layer 230 such that a portion of the second protective layer 240 corresponding to the gate pad 210 may be opened.

The first metal layer 250 may be formed on the second protective layer 240, and may be connected to the gate pad 210 through a contact hole that exposes the gate pad 210. In one example, the first metal layer 250 may be formed of the same material as that of the pixel electrode 251 through the same process as that of the pixel electrode 251.

The third protective layer 260 may be formed on the first metal layer 250 and the second protective layer 240, and may be formed as a passivation layer.

The second metal layer 270 may be formed on the third protective layer 260, and may be connected to the first metal layer 250 through a contact hole that exposes the first metal layer 250. In addition, the second metal layer 270 may be connected to the first metal layer 250, and the first metal layer 250 may be connected to the gate pad 210, and the second metal layer 270 may be electrically connected to the gate pad 210. In one example, the second metal layer 270 may be formed of the same material as that of the common electrode 271 through the same process as that of the common electrode 271.

In one example, by forming the first metal layer 250 in an internal area of a first contact hole 280, the first metal layer 250 may be used as a connection line between the gate pad 210 and the second metal layer 270. When a contact hole is to be formed at a surface of the gate pad 210 because the first metal layer 250 is not formed on the gate pad 210, the gate pad 210 may be damaged due to overetching.

Figure 6A:
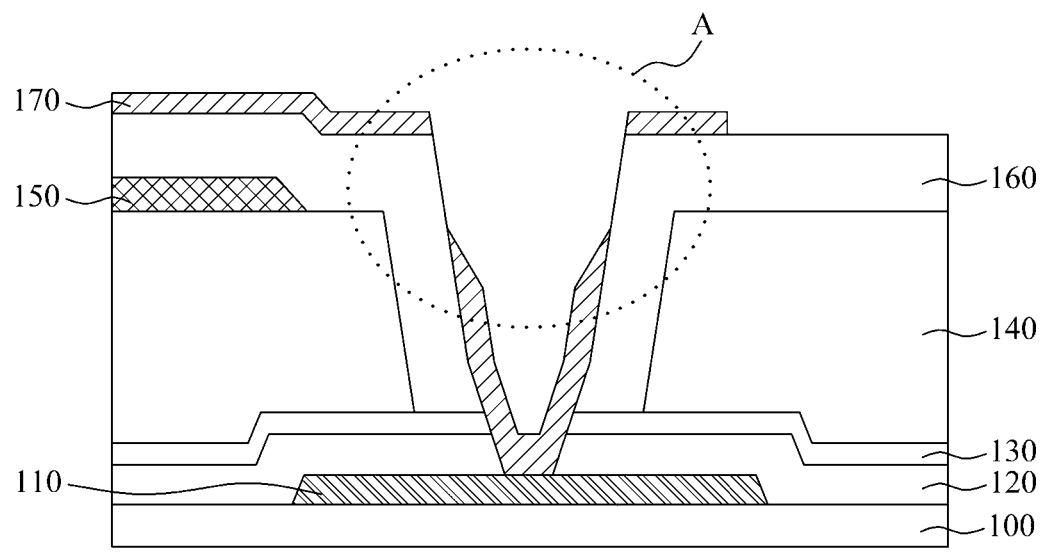
FIG. 6A is an enlarged sectional view of a portion A of FIG. 5.
Figure 6B:
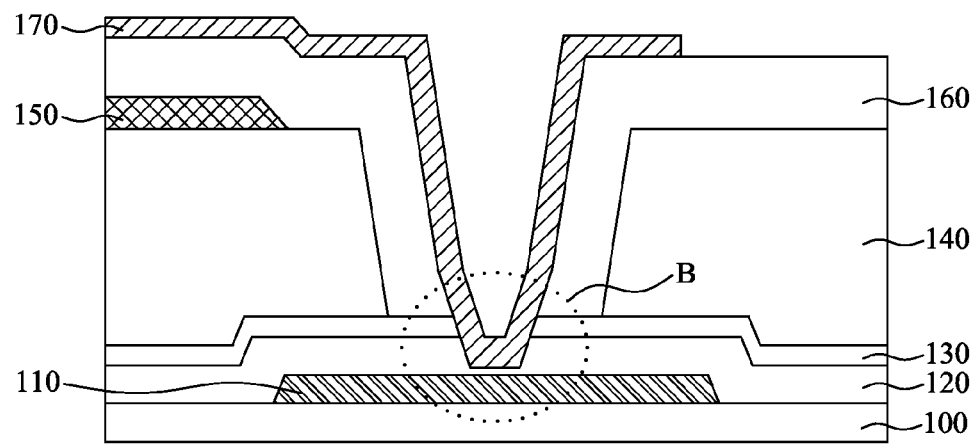
FIG. 6B is an enlarged sectional view of a portion B of FIG. 5.

Moreover, the first metal layer 250 may be additionally formed between the gate pad 210 and the second metal layer 270, and thus, a step height between the gate pad 210 and the second metal layer 270 may be reduced, solving the disconnection of the second metal layer 270 in the related art shown in FIG. 6B.

In addition, a data pad area DP may include the substrate 200, the gate insulating layer 220, a data pad 215, the first protective layer 230, the second protective layer 240, the third protective layer 260, and the second metal layer 270.

The data pad 215 may be formed on the gate insulating layer 220, and may be formed of the same material as that of the source electrode 212 and the drain electrode 213 though the same process as that of the source electrode 212 and the drain electrode 213. The first to third protective layers 230, 240, and 260 may be formed on the data pad 215. In one example, the first and third protective layers 230 and 260 may be formed as passivation layers, and the second protective layer 240 may be formed of photo acryl. The second protective layer 240 may be formed on the first protective layer 230 such that a portion of the second protective layer 240 corresponding to the gate pad 210 may be opened.

The second metal layer 270 may be formed on the third protective layer 260, and connected to the data pad 215 through a contact hole that may expose the data pad 215. In one example, the second metal layer 270 may be formed of the same material as that of the common electrode 271 through the same process as that of the common electrode 271.

Figure 8:
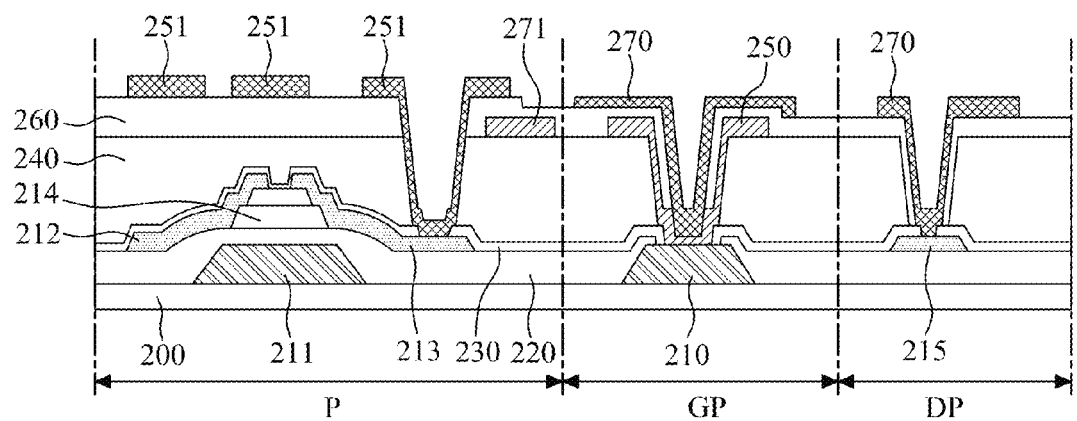
FIG. 8 is a sectional view illustrating an array substrate for LCDs according to an embodiment.

FIG. 8 is a sectional view illustrating an array substrate for LCDs according to an embodiment.

In FIG. 8, a pixel electrode 251 and a common electrode 271 may be formed in a pixel area P in a stack order which differs from that of FIG. 7. That is, according to the example of FIG. 8, the common electrode 271 may be formed on a second protective layer 240, and the pixel electrode 251 may be formed on a third protective layer 260. In this way, the pixel electrode 251 may be formed at a position higher than that of the common electrode 271, and may be connected to a drain electrode 213 through a contact hole.

Except for such a configuration, the example of FIG. 8 is the same as the example of FIG. 7, and thus, a repetitive description of the gate pad area GP and the data pad area DP is not provided.

Hereinafter, a gate pad area of an array substrate for LCDs according to embodiments will be described in detail with reference to FIGS. 9 to 14. Moreover, in the following description, drawings for the below-described pixel electrode and common electrode refer to FIGS. 7 and 8.

FIGS. 9 to 14 are sectional views for describing a method of manufacturing a gate pad area of an array substrate for LCDs, according to an embodiment.

Figure 9:
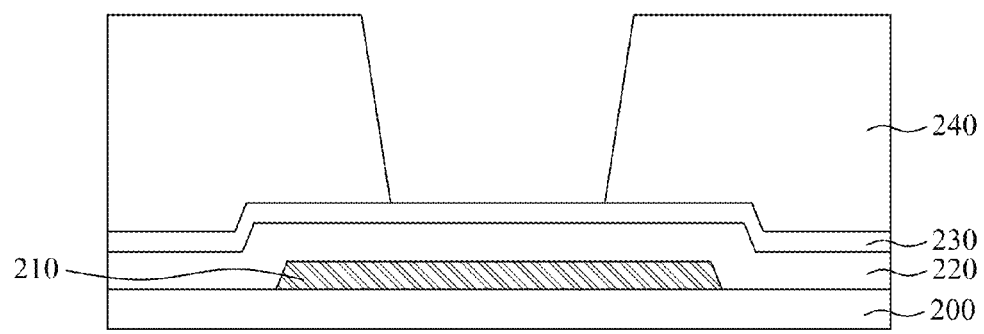
FIGS. 9 to 14 are sectional views for describing a method of manufacturing a gate pad area of an array substrate for LCDs according to an embodiment.

First, as illustrated in FIG. 9, a gate pad 210 may be formed on a substrate 200, and then a gate insulating layer 220, a first protective layer 230, and a second protective layer 240 may be sequentially formed on the gate pad 210. In one example, the first protective layer 230 may be formed as a passivation layer, and the second protective layer 240 may be formed of photo acryl. As an example, the second protective layer 240 may be formed on the first protective layer 230 such that the first protective layer 230 formed at a position corresponding to the gate pad 210 may be exposed.

Figure 10:
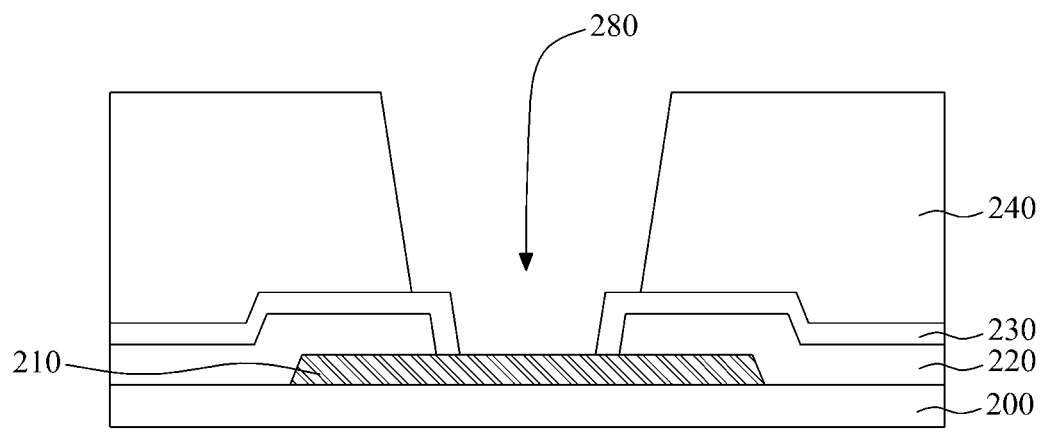

Subsequently, as illustrated in FIG. 10, a first contact hole 280 that exposes the gate pad 210 may be formed by patterning the gate insulating layer 220 and the first protective layer 230. For example, photoresist may be coated on the second protective layer 240, and a photoresist pattern may be formed by an exposure and development process. Subsequently, the first contact hole 280 that exposes the gate pad 210 may be formed by etching the gate insulating layer 220 and the first protective layer 230 with the photoresist pattern.

Figure 11:
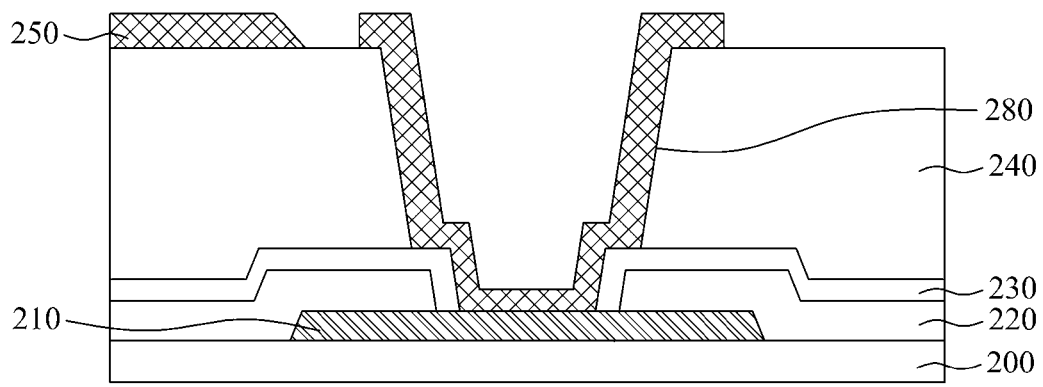

Subsequently, as illustrated in FIG. 11, a first metal layer 250 may be formed on the first contact hole 280 and the second protective layer 240. The first metal layer 250 may be formed on the second protective layer 240 and in an internal area of the first contact hole 280 other than the first contact hole area. The first metal layer 250, which may be formed on the second protective layer 240 other than the first contact hole 280, and the first metal layer 250, which may be formed in the internal area of the first contact hole, may be formed of the same material through the same process.

In one example, the first metal layer 250, which may be formed on the second protective layer 240 other than the first contact hole area, may be used as an electrode, and the first metal layer 250, which may be formed in the internal area of the first contact hole 280, may be used as a connection line between the gate pad 210 and another metal layer.

In other words, the first metal layer 250, which may be formed on the second protective layer 240 other than the first contact hole area, may be used as a pixel electrode or a common electrode. The first metal layer 250, which may be formed in the internal area of the first contact hole 280, may be formed on the gate pad 210, and may be used as the connection line between the gate pad 210 and the other metal layer that is additionally formed on the first metal layer 250.

Figure 12:
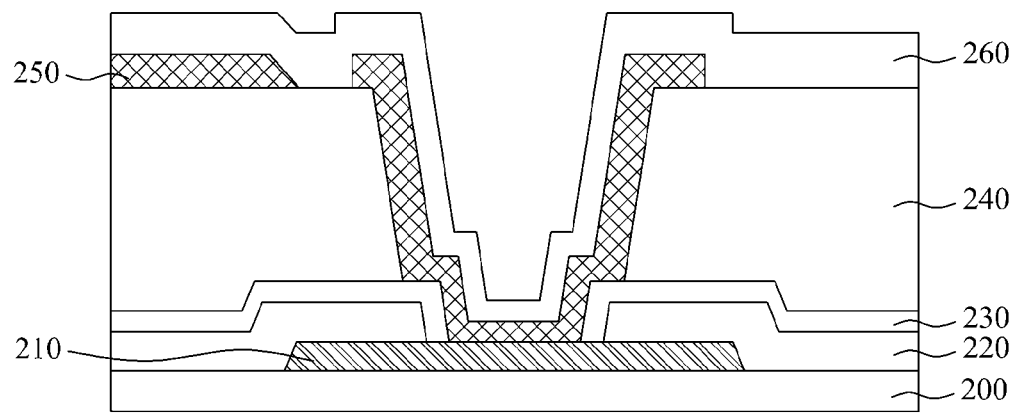

Subsequently, as illustrated in FIG. 12, the first metal layer 250 and the second protective layer 240 may be formed on the third protective layer 260. In one example, the third protective layer 260 may be formed as a passivation layer.

Figure 13:
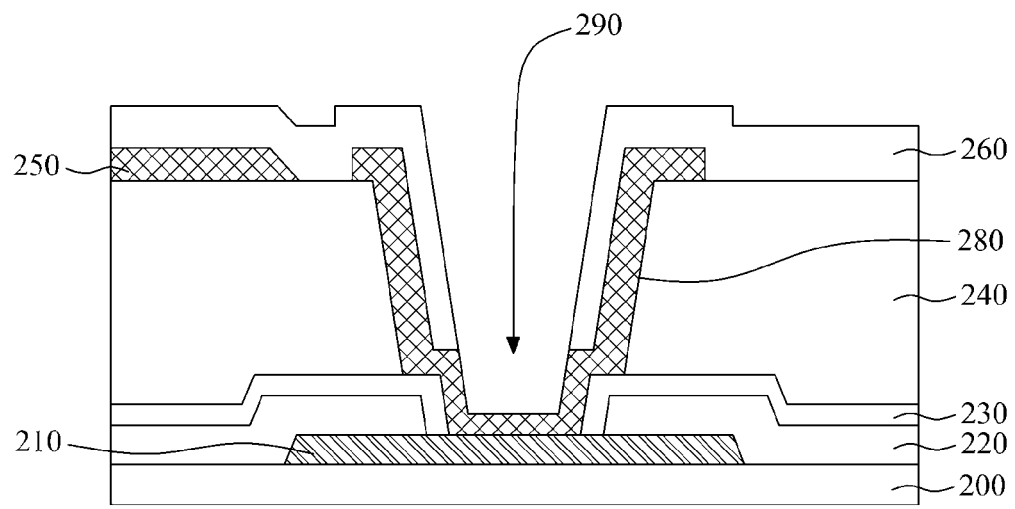

Subsequently, as illustrated in FIG. 13, a second contact hole 290 that exposes the first metal layer 250, formed in the internal area of the first contact hole 280, may be formed by patterning the third protective layer 260. For example, photoresist may be coated on the third protective layer 260, and a photoresist pattern may be formed by an exposure and development process. Subsequently, the second contact hole 290 that exposes the first metal layer 250, formed in the internal area of the first contact hole 280, may be formed by etching the third protective layer 260 with the photoresist pattern.

Figure 14:
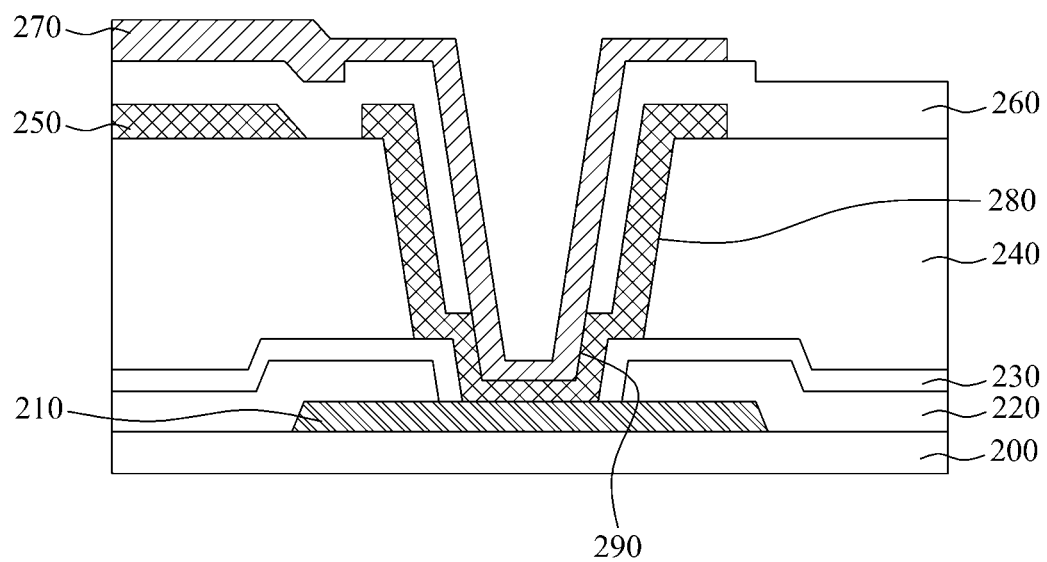

Subsequently, as illustrated in FIG. 14, a second metal layer 270 may be formed on the second contact hole 290 and the third protective layer 260. The second metal layer 270 may be used as a pixel electrode or a common electrode.

As an example, when the first metal layer 250, which is formed on the second protective layer 240 other than the first contact hole area, is used as the pixel electrode, the second metal layer 270 may be used as the common electrode. When the first metal layer 250, which is formed on the second protective layer 240 other than the first contact hole area, is used as the common electrode, the second metal layer 270 may be used as the pixel electrode.

In this way, as illustrated in FIGS. 11 to 14, by forming the first metal layer 250 even in the internal area of the first contact hole 280, the first metal layer 250 may be used as a connection line between the gate pad 210 and the second metal layer 270. When a contact hole is to be formed at a surface of the gate pad 210 because the first metal layer 250 is not formed on the gate pad 210, the gate pad 210 may be damaged due to overetching.

Moreover, according to embodiments, when a contact hole is deep, the contact hole may be formed by performing a punching process twice, and thus, a lower residual layer that is left without being etched by a one-time process may be removed.

Moreover, the first metal layer 250 may be additionally formed between the gate pad 210 and the second metal layer 270, and thus, a step height between the gate pad 210 and the second metal layer 270 may be reduced, thus solving the disconnection of the second metal layer 270 shown in the related art of FIG. 6B.

In the specification, the method of manufacturing the array substrate for LCDs has been described only up to a process of forming second electrode layer, but the technical spirit and scope of embodiments are not limited thereto. A process of forming the common electrode may be performed, and then an additional process of manufacturing a display device integrated with a touch screen may be further performed.

According to embodiments, in the array substrate for LCDs and the manufacturing method thereof, the first metal layer may be additionally formed between the gate pad and the second metal layer, and thus, the step height between the gate pad and the second metal layer may be reduced, thus solving the disconnection of the second metal layer as shown in the FIG. 6B related art.

Moreover, according to embodiments, in the array substrate for LCDs and the manufacturing method thereof, when the contact hole is deep, the contact hole may be formed by performing a punching process twice, and thus, the lower residual layer that is left without being etched by a one-time process can be removed.

Moreover, according to embodiments, in the array substrate for LCDs and the manufacturing method thereof, the first metal layer may be formed even in the internal area of the first contact hole, and thus may be used as the connection line between the gate pad and the second metal layer.

It will be apparent to those skilled in the art that various modifications and variations can be made in embodiments of the present invention without departing from the spirit or scope of the invention. Thus, it is intended that the present invention cover the modifications and variations of this invention provided they come within the scope of the appended claims and their equivalents.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An array substrate for a liquid crystal display (LCD), comprising:
   a substrate, comprising:
      a gate electrode;
      a pixel electrode configured to receive a data signal; and
      a common electrode configured to receive a common voltage, the gate electrode, the pixel electrode, and the common electrode being disposed on a pixel area defined on the substrate;
   a gate pad on a gate pad area of the substrate, such that the gate pad is disposed in a same layer as the gate electrode, the gate pad being connected to the gate electrode;
   a gate insulating layer covering the gate pad and the gate electrode;
   a first protective layer on the gate insulating layer;
   a second protective layer on the first protective layer;
   a first metal layer on the second protective layer corresponding to the gate pad area, and connected to the gate pad through a first contact hole which exposes the gate pad;
   a third protective layer covering the common electrode, the first metal layer, and the second protective layer; and
   a second metal layer on the third protective layer corresponding to the gate pad area, and connected to the first metal layer through a second contact hole which exposes the first metal layer,
   wherein the common electrode is disposed:
      on the second protective layer,
      on a same plane as the first metal layer, and
   wherein the pixel electrode is disposed:
      on the third protective layer, and
      on a same plane as the second metal layer.

2. The array substrate for LCDs of claim 1, wherein:
   the first metal layer comprises a same material as the common electrode; and
   the second metal layer comprises a same material as the pixel electrode.

3. The array substrate for LCDs of claim 2, wherein the first metal layer comprises a same material as the second metal layer.

4. The array substrate for LCDs of claim 1, wherein the second contact hole is formed in an internal area of the first contact hole.

5. The array substrate for LCDs of claim 1, wherein:
   the first metal layer is disposed in an internal area of the first contact hole; and
   the first metal layer comprises a connection line between the gate pad and the second metal layer.

6. The array substrate for LCDs of claim 1, wherein the second protective layer is disposed on the first protective layer, such that a portion of the second protective layer corresponding to the gate pad is opened.

7. The array substrate for LCDs of claim 1, wherein the second protective layer comprises a photo acryl (PAC).

8. The array substrate for LCDs of claim 1, wherein the first and third protective layers are passivation layers.

9. An array substrate for a liquid crystal display (LCD), comprising:
   a substrate;
   a pixel area on the substrate, the pixel area comprising:
      a transistor, comprising:
         a gate electrode;
         a source electrode;
         a drain electrode;
         an active layer; and
         a gate insulating layer;
      a first protective layer on the transistor;
      a second protective layer on the first protective layer;
      a common electrode on the second protective layer;
      a third protective layer completely covering the common electrode and the second protective layer; and
      a pixel electrode connected to the drain electrode through a first contact hole that exposes the drain electrode; and a gate pad area on the substrate, the gate pad area comprising:
  a gate pad disposed in a same layer as the gate electrode;
  the gate insulating layer;
  the first protective layer;
  the second protective layer;
  a first metal layer;
  the third protective layer; and
  a second metal layer,
  wherein the first metal layer is disposed on the second protective layer, and is connected to the gate pad through a second contact hole that exposes the gate pad,
  wherein the first metal layer comprises a same material and is disposed in a same layer as the common electrode,
  wherein the third protective layer is disposed on the first metal layer and the second protective layer,
  wherein the second metal layer is disposed on the third protective layer, and is connected to the first metal layer through the second contact hole that exposes the first metal layer,
  wherein the second metal layer is electrically connected to the gate pad, and
  wherein the pixel electrode comprises a same material as the second metal layer, and
  wherein the pixel electrode is disposed:
    on the third protective layer, and
    in a same layer as the second metal layer.

10. The array substrate for LCDs of claim 9, wherein the first metal layer comprises a same material as the second metal layer.

11. The array substrate for LCDs of claim 9, wherein the second contact hole is formed in an internal area of the first contact hole.

12. The array substrate for LCDs of claim 9, wherein:
  the first metal layer is disposed in an internal area of the first contact hole; and
  the first metal layer comprises a connection line between the gate pad and the second metal layer.

13. The array substrate for LCDs of claim 9, wherein the second protective layer is disposed on the first protective layer, such that a portion of the second protective layer corresponding to the gate pad is opened.

14. The array substrate for LCDs of claim 9, wherein the second protective layer comprises a photo acryl (PAC).

15. The array substrate for LCDs of claim 9, wherein the first and third protective layers are passivation layers.

16. The array substrate for LCDs of claim 9, further comprising:
  a data pad area on the substrate, the data pad area comprising:
    the gate insulating layer;
    a data pad disposed on the gate insulating layer, and comprising a same material and in a same layer as the source electrode and the drain electrode;
    the first protective layer;
    the second protective layer;
    the third protective layer; and
    the second metal layer.

17. The array substrate for LCDs of claim 16, wherein the second metal layer on the data pad area is disposed on the third protective layer; and the second metal layer, and is connected to the data pad through a third contact hole that exposes the data pad.

18. The array substrate for LCDs of claim 16, wherein the second metal layer on the data pad area comprises the same material and is in a same layer as the pixel electrode.

* * * * *